United States Patent
Kim

(10) Patent No.: US 7,283,420 B2
(45) Date of Patent: Oct. 16, 2007

(54) MULTI-PORT MEMORY DEVICE

(75) Inventor: Kyung-Whan Kim, Ichon-shi (KR)

(73) Assignee: Hynix Semiconductor Inc. (KR)

(*) Notice: Subject to any disclaimer, the term of this patent is extended or adjusted under 35 U.S.C. 154(b) by 0 days.

(21) Appl. No.: 11/320,966

(22) Filed: Dec. 30, 2005

(65) Prior Publication Data

US 2006/0221757 A1   Oct. 5, 2006

(30) Foreign Application Priority Data

Mar. 31, 2005   (KR) .................. 10-2005-0027400

(51) Int. Cl.
*G11C 8/00* (2006.01)
(52) U.S. Cl. .................. 365/230.05; 365/230.03; 365/189.04
(58) Field of Classification Search .......... 365/230.05, 365/230.03, 189.04
See application file for complete search history.

(56) References Cited

U.S. PATENT DOCUMENTS

| | | | |
|---|---|---|---|
| 5,124,950 A | | 6/1992 | Fukushi et al. |
| 5,319,603 A | * | 6/1994 | Watanabe et al. ...... 365/230.05 |
| 5,400,274 A | | 3/1995 | Jones et al. |
| 5,726,948 A | * | 3/1998 | Hush et al. ............ 365/230.05 |
| 5,999,023 A | | 12/1999 | Kim |
| 6,044,034 A | | 3/2000 | Katakura |
| 7,016,255 B2 | * | 3/2006 | Lee et al. ............... 365/230.05 |
| 7,196,862 B1 | * | 3/2007 | Adams et al. ................ 360/51 |
| 2004/0246807 A1 | | 12/2004 | Lee |

FOREIGN PATENT DOCUMENTS

| | | |
|---|---|---|
| JP | 2000-48570 A | 2/2000 |
| JP | 2004-362760 | 12/2004 |
| KR | 2002-0096462 | 12/2002 |
| KR | 10-2005-0063306 | 6/2005 |
| KR | 10-2005-0067448 | 7/2005 |
| KR | 10-2005-0106906 | 11/2005 |

\* cited by examiner

*Primary Examiner*—Connie C. Yoha
(74) *Attorney, Agent, or Firm*—McDermott Will & Emery LLP

(57) ABSTRACT

The present invention proposes a multi-port memory device for preventing a degradation of a global data drive efficiency by turning off the switches which do not discharge a global data bus. The multi-port memory device includes a global data bus containing a plurality of bus lines; a plurality of banks including a transmitter and a receiver for exchanging a data with the global data bus; a plurality of ports including the transmitter and the receiver; a plurality of switches for selectively connecting the transmitter and the receiver with the global data bus; and a switching controller for generating a switch signal in response to a drive pulse and a data signal inputted to the transmitter, wherein the switch signal turns off the switches corresponding to the banks which are not discharging the global data bus.

16 Claims, 16 Drawing Sheets

MULTI-PORT MEMORY DEVICE

FIELD OF THE INVENTION

The present invention relates to a multi-port memory device; and, more particularly, to a multi-port memory device for performing an effective data transmission.

DESCRIPTION OF PRIOR ART

Most memory devices including DRAM contain a single port for exchanging data with a chipset. Herein, the single port usually includes a plurality of I/O pin sets. Meanwhile, a functional classification of the chipset and the memory device becomes more ambiguous; and, therefore, it is seriously considered to integrate the memory device and the chipset. In order to satisfy the integration, a multi-port memory device for directly exchanging data with peripheral devices such as a graphic device and a CPU is required. For implementing the multi-port memory device, every port in the multi-port memory device has access to every memory cell in the multi-port memory device.

FIG. 1 is a block diagram describing a 256M multi-port memory device disclosed in a commonly owned copending application, U.S. Ser. No. 10/750,156, filed on Dec. 31, 2003, entitled "MULTI-PORT MEMORY DEVICE", which is incorporated herein by reference.

As shown, the 256M multi-port memory device includes a plurality of banks BANK0 to BANK15, a plurality of row decoders RDEC, an controller 100, a plurality of ports PORT0 to PORT7, a first to fourth global data buses GIO_LU, GIO_RU, GIO_LD, and GIO_RD, a first and second global data bus connectors PR_U and PR_D, a plurality of transfer buses TBs, a plurality of transfer bus connectors TGs, a plurality of bus connectors TLs, and a plurality of data transfer units QTRXs.

Each of the banks BANK0 to BANK15 includes an 8K×2K DRAM, i.e., 16M DRAM, the row decoder RDEC, and a core circuit such as a sense amplifier and an equalizer which are necessary for general DRAM core area. Every four banks of the banks BANK0 to BANK15 are arranged in a row at a corresponding quadrant dividing the core area into four. In the concrete, there are included BANK0, BANK2, BANK4, and BANK6 in a first quadrant placed in an upper left side of the core area. BANK8, BANK10, BANK12, and BANK14 are in a second quadrant placed in an upper right side of the core area. BANK1, BANK3, BANK5, BANK7 are in a third quadrant placed in a lower left side of the core area. BANK9, BANK11, BANK13, and BANK15 are in a fourth quadrant placed in a lower right side of the core area. Meanwhile, it is advisable to arrange the two row decoders RDEC between each neighboring banks in the same quadrant. Further, a column of the banks BANK0 to BANK15 is divided into four segments. Thus, each of the four segments is constituted with 512 cells.

The controller 100 generates an internal command signal, an internal address signal, and a control signal to thereby control an operation of the memory device. The internal command signal includes an internal active command signal ACT, an internal precharge command signal PCG, an internal read command signal RD, and an internal write command signal WD. The internal address signal includes an active array address AAA, a precharge array address PAA, a read array address RAA, a write array address WAA, a row address RA, a read segment address RSA, and a write segment address WSA. The control signal includes transfer gate control signal TGC, a port/pipe register flag signal PRFG, a port/pipe register data driving signal DP, and a DRAM core test mode flag signal DTM.

The ports PORT0 to PORT7 are placed at the margin of a die. Every two ports of the ports PORT0 to PORT7 are arranged to each of the quadrants. In detail, PORT0 and PORT2 are in the first quadrant; PORT4 and PORT6 are in the second quadrant; PORT1 and PORT3 are in the third quadrant; PORT5 and PORT7 are in the fourth quadrant. Each of the ports PORT0 to PORT7 supports a serial I/O interface and communicates independently with a different target device such as a graphic chip. When the ports PORT0 to PORT7 support the serial I/O interface, every port has a plurality of pads corresponding to data, commands, and addresses, a plurality of pad buffers for buffering a signal transmitted to the pads, a decoder for decoding a data to be transmitted, an encoder for encoding a received data, and data transformer for transforming the serial received data into a parallel data or transforming the parallel data into a serial data.

The first to fourth global data buses GIO_LU, GIO_RU, GIO_LD, and GIO_RD are placed between the bank and the port of the corresponding quadrants, respectively. In detail, the first global data bus GIO_LU is in the first quadrant; the second global data bus GIO_RU is in the second quadrant; the third global data bus GIO_LD is in the third quadrant; the fourth global data bus GIO_RD is in the fourth quadrant. The first to fourth global data buses GIO_LU, GIO_RU, GIO_LD, and GIO_RD are 512-bit bidirectional data buses coupled to the banks and the ports of the corresponding quadrant and the first and the second global data bus connectors PR_U and PR_D.

Herein, the first global data bus GIO_LU and the second global data bus GIO_RU are connected through the first global data bus connector PR_U. The third global data bus GIO_LD and the fourth global data bus GIO_RD are connected through the second global data bus connector PR_D. The first and second global data bus connector PR_U and PR_D include 512 numbers of bidirectional pipe registers corresponding to the 512-bit global data buses.

The transfer bus TB is a local data bus connecting a bit line sense amplifier and the bus connectors TL of the corresponding bank. The number of lines of the transfer bus TB is corresponding to the number of cells in one segment, e.g., 512. The transfer bus TB is implemented with a differential bus.

The transfer bus connector TG is implemented with a plurality of MOS transistors. The number of the MOS transistors is corresponding to the number of lines of the transfer bus TB. Because the transfer bus TB is a differential bus, one transfer bus connector TG is implemented with 512 pairs of MOS transistors. Accordingly, the transfer bus connector TG is called a transfer gate.

One set of transfer latch is formed with 512 numbers of transfer latches. The bus connector TL includes 16 sets of transfer latches. Each transfer latch includes a first bus connecting circuit for a read operation and a second bus connecting circuit for a write operation. Herein, the first bus connecting circuit corresponding to an I/O sense amplifier of DRAM and includes a read sense amplifier for sensing and latching a read data on the transfer bus TB and a read driver for driving the latched read data into the global data bus of the corresponding quadrant. Further, the second bus connecting circuit corresponding to a write driver of DRAM includes a write latch for sensing and latching a write data on the global data bus and a write driver for driving a write data into the transfer bus TB.

The data transfer unit QTRX includes 512 numbers of transmitters QTX for transmitting a write data inputted to a corresponding port and 512 numbers of receivers QRX for receiving a read data inputted from the global data bus to thereby transmit to a corresponding port.

Besides, although not shown in FIG. 1, the 256M multi-port DRAM further includes a voltage generator, a test logic, and various pads including a clock pad (not shown). The voltage generator placed at the margin of the 256M multi-port DRAM receives an external voltage to thereby generate an internal voltage. The test logic is arranged between the ports corresponding to the first quadrant and the second quadrant and arranged between the ports corresponding to the third quadrant and the fourth quadrant. The pads are also placed at the margin of the 256M multi-port DRAM.

Further, each of the quadrants includes command lines for receiving the internal command signals and 2-bit address lines for receiving the internal address lines (not shown). The command lines and the address lines deliver from the controller 100 to the banks BANK0 to BANK15. At each of left and right side of the controller 100, a 4-bit transfer gate control line TGC<0:3> reaching from the controller 100 and to the transfer bus connector TG is exist (not shown).

FIG. 2 is a block diagram showing a relationship between the transfer bus and the segment, i.e., a column unit of the 256M multi-port DRAM shown in FIG. 1.

As shown, the 256M multi-port DRAM includes a memory cell array 200 and a bit line sense amplifier array 210. Referring to a block denoted as A, one transfer bus pair TB<0> and TBb<0> of the memory cell array 200 are connected to four bit line sense amplifiers BLSA arranged upper and lower side of the memory cell array 200. The four bit line sense amplifier BLSA are controlled by a segment select signal SGS<0:3>, respectively. Herein, the segment select signal SGS is corresponding to a column select signal of the conventional DRAM. In case of 2K column, when a predetermined row and a predetermined segment are selected at a time, 512 cells are selected and data of the 512 cells are transferred into the 512-bit transfer bus TB<0:511> corresponding to the 512 cells.

Each of transfer buses TB in the first quadrant is connected to a corresponding transfer bus TB in the third quadrant through the transfer gate TG. Herein, one set of the transfer gate is constituted with 512 transfer gates TG and eight sets of transfer gates TG are provided in the 256M multi-port DRAM. That is, the transfer gate is placed between two transfer buses TB, each corresponding to two banks arranged in the same column to thereby selectively connect the two transfer buses TB to each other. The transfer gate control signal TCG for controlling the transfer gate TG is generated in the controller 100.

Hereinafter, an operation of the 256M multi-port DRAM is explained.

FIGS. 3A and 3B are block diagrams describing a normal read path and a normal write path of the 256M multi-port DRAM, respectively.

Herein, the normal read and write paths refer to data paths of the read and the write operations occurred in same quadrant. For example, under the case of the normal read and write paths, the commands and addresses for the read or write operation inputted through a port in the first quadrant, i.e., the first port PORT1 or the third port PORT2, are only able to access the memory cells in the first quadrant.

As shown in FIG. 3A, when the 256M multi-port DRAM reads a 512-bit read data of a predetermined segment in the first bank BANK0 through the first port PORT0, the commands and addresses relating to the read operation are inputted to the controller 100 in a form of packet through the first port PORT0. The controller 100 generates the internal active command signal ACT, the active array address AAA, and the row address RA corresponding to the first bank BANK0 to thereby activate a predetermined row, i.e., a word line WL, in the first bank BANK0. Then, the controller 100 generates the read command signal RD, the read array address RAA, and read segment address RSA corresponding to the first bank BANK0. The bit line sense amplifier BLSA senses and amplifies the 512-bit read data of a segment corresponding to the read segment address RSA to thereby transfer the 512-bit read data to the pair of transfer bus TB and TBb.

Meanwhile, the bus connector TL of the first bank BANK0 senses the 512-bit read data loaded on the pair of transfer bus TB and TBb and, then, transmits the 512-bit read data to the first global data bus GIO_LU. Subsequently, the 512-bit read data transmitted to the first global data bus GIO_LU is buffered in a read buffer of the first port PORT0 after passing through the receiver QRX of the data transfer unit QTRX corresponding to the first port PORT0. The 512-bit read data in read buffer is transformed to packets of a predetermined size and serially transmitted to a target device connected to the first port PORT0.

Next, the controller 100 generates the internal precharge command signal PCG and the precharge array address PAA to thereby inactivates the word line WL. The transfer bus connector TG corresponding to the internal precharge command signal PCG and the precharge array address PAA is switched-off. Therefore, the transfer bus pair TB and TBb of the first bank BANK0 and the transfer bus pair TB and TBb of the second band BANK1 are disconnected. Herein, in FIG. 3A, BL and BLb denote a bit line pair; T denotes a cell transistor; and C denotes a cell capacitor.

Hereinafter, a case which the 256M multi-port DRAM writes a 512-bit write data to a predetermined segment in the first bank BANK0 through the first port PORT0 is explained by referring FIG. 3B.

As shown, after the commands and addresses relating to the write operation and the 512-bit write data are inputted to the controller 100 in a packet form through the first port PORT0, the controller 100 generates the internal active command signal ACT, the active array address AAA, and the row address RA corresponding to the first bank BANK0 to thereby activate a predetermined row, i.e., a word line WL, in the first bank BANK10. Then, the controller 100 generates the internal write command signal WD, the write array address WAA, and the write segment address WSA corresponding to the first bank BANK0.

The 512-bit write data buffered in a write buffer of the first port PORT0 is written to the segment corresponding to the write segment address WSA in accordance with a scheduling of the controller 100. That is, the 512-bit write data transformed into a parallel data is loaded to the first global data bus GIO_LU through the transmitter QTX of the data transfer units QTRX. Then, the 512-bit write data is loaded to the pair of the transfer bus TB and TBb after passing through the bus connector TL of the first bank BANK0. Subsequently, the 512-bit write data loaded in the pair of the transfer bus TB and TBb is stored in 512 numbers of memory cells, i.e., the segment, by the bit line sense amplifier BLSA corresponding to the write segment address WSA.

Finally, the controller 100 generates the internal precharge command signal PCG and the precharge array address PAA to thereby inactivate the word line.

FIGS. 4A and 4B are block diagrams describing a cross read path and a cross write path of the 256M multi-port DRAM, respectively.

Herein, the cross read and write paths refer to data paths of the read and the write operations occurred between different quadrants, respectively. For example, under the case of the cross read and write paths, it is possible to access the memory cells in the third quadrant for the commands, addresses, and data inputted through the first port PORT0 in the first quadrant.

As shown in FIG. 4A, when the 256M multi-port DRAM reads a 512-bit read data of a predetermined segment in the first bank BANK0 through the second port PORT1, the whole operations are similar to that of the case of the normal read path. However, the transfer bus connector TG coupled between the first and the second banks BANK0 and BANK1 is switched-on and, therefore, the pair of the transfer bus TB and TBb of the first bank BANK0 and the pair of the transfer bus TB and TBb of the second bank BANK1 are connected to each other. The 512-bit read data is loaded to the transfer bus pair TB and TBb of the second bank BANK1 and transmitted to a target device after passing through the bus connectors TL connected to the second bank BANK1, the third global data bus GIO_LD, the data transfer unit QTRX connected to the second port PORT1, and the second port PORT1.

Next, a case that the 256M multi-port DRAM writes a 512-bit write data to a predetermined segment in the first bank BANK0 through the second port PORT1 is explained, referring to FIG. 4B.

As shown, the whole operations are similar to that of the normal write path. However, the transfer bus connector TG coupled between the first and the second banks BANK0 and BANK1 is switched-on; and, therefore, the transfer bus pair TB and TBb of the first bank BANK0 and the pair of the transfer bus TB and TBb of the second bank BANK1 are connected. In this case, the 512-bit write data inputted through the second port PORT1 is loaded on the transfer bus pair TB and TBb of the first bank BANK0 after passing through the data transfer unit QTRX connected to the second port PORT1, the third global data bus GIO_LD, the bus connectors TL connected to the second bank BANK1. The process thereafter is same with that of the normal write.

Meanwhile, when the data is transmitted between the first and the second global data buses GIO_LU and GIO_RU, the first and the second global data buses GIO_LU and GIO_RU are connected via the first global data bus connector PR_U. Further, when the data is transferred between the third and the fourth global data buses GIO_LD and GIO_RD, the third and the fourth global data buses GIO_LD and GIO_RD are connected through the second global data bus connector PR_D.

As abovementioned, every port PORT0 to PORT7 in the conventional 256M multi-port memory device can access to every segment in the conventional 256M multi-port memory device. Further, because each of the ports PORT0 to PORT7 accesses to the segment independently, the segment can be concurrently accessed by plural ports PORT0 to PORT7 as long as each of the first to the fourth global buses GIO_LU to GIO_RD are not used concurrently. Moreover, the data is inputted or outputted serially between the ports PORT0 to PORT7 and the target device and the 512-bit data is processed in parallel manner between the ports PORT0 to PORT7 and each quadrant of the core area. Thus, the present invention makes it possible to minimize a layout size, facilitate a package, and increase a bandwidth without causing a skew between data lines in a data bus.

FIG. 5 is a diagram showing a data transmitting structure of the 256M multi-port DRAM shown in FIG. 1.

As shown, the 256M multi-port DRAM includes a global data bus GIO for use in exchanging a data between an input/output interface, i.e., a port and a memory cell block, i.e., a bank. Further, the 256M multi-port DRAM also includes a data transfer units QTRX for receiving or transmitting a data between the global data bus GIO and the port and a bus connectors TL for receiving or transmitting a data between the global data bus GIO and the bank.

FIG. 6 is a block diagram describing a structure of the global data bus GIO shown in FIG. 5.

As shown, the 256M multi-port DRAM is divided into four quadrants QUADRANT_LU, QUADRANT_RU, QUADRANT_LD, and QUADRANT_RD. Each of the four quadrants has the same structure and operates independently.

Looking at the first quadrant QUADRANT_LU, the first global data bus GIO_LU is connected to four banks BANK0, BANK2, BANK4, and BANK6, two ports PORT0 and PORT2, and the first global data bus connector PR_U. That is, seven blocks are connected to one global data bus. When a global data is shared by several blocks, it can be caused that a load of the global data increases and that a data interference occurs.

FIG. 7 is a block diagram showing a worst read case and a worst write case of the 256M multi-port DRAM shown in FIG. 1.

As shown, a single global data bus is provided with 512 bus lines and is formed with a hierarchical wiring structure. That is, a first metal wire and a second metal wire are provided for vertical and horizontal bus lines, respectively. Generally, a resistance of the first metal wire for the vertical bus line is higher than a resistance of the second metal wire for the horizontal bus line.

Meanwhile, length of the first metal wires connected to a single bank are different from one another. Therefore, a loading value of each bus line becomes different. The loading value also can be varied depending on a data transmit path as well as the difference of the length of the first metal wire. For example, the data transmit path between the first port PORT0 and the seventh bank BANK6 is the longest path in FIG. 7. Therefore, the loading value between the first port PORT0 and the seventh bank BANK6 has the largest value and, thus, the read or write operation occurring between the first port PORT0 and the seventh bank BANK6 becomes the worst read or write case.

As abovementioned, the 256M multi-port DRAM includes the 512-bit global data bus. When the number of the bus lines in the global data bus is more than 64-bit, a great amount of a current is consumed.

In order to reduce a problem caused by the great current consumption of the wide band global data bus, the applicant of the present application proposed a global data bus structure using a current sense method instead of a voltage drive method in U.S. Ser. No. 10/788,704.

FIG. 8 is a block diagram describing a data transfer unit QTRX and bus connector TL disclosed in a commonly owned copending application, U.S. Ser. No. 10/788,704, filed on Feb. 27, 2004, entitled "SEMICONDUCTOR MEMORY DEVICE", which is incorporated herein by reference.

As shown, the bus connector TL and the data transfer unit QTRX are connected through the global data bus GIO.

A receiver RX of the bus connector TL is provided with two PMOS transistor P1 and P2, three NMOS transistor N1, N2, and N9. First terminals of the first PMOS transistor P1 and the second PMOS transistor P2 are connected to a power voltage VDD. A second terminal and a gate of the first PMOS transistor P1 are diode-connected to each other. A second terminal of the second PMOS transistor P2 is connected to a first output terminal. A first terminal of the first NMOS transistor N1 is connected with the second terminal of the first PMOS transistor P1 at node A1. A second terminal of the first NMOS transistor N1 is connected to the global data bus GIO. The first NMOS transistor N1 and the second NMOS transistor N2 receive a reference voltage VR through gates. A first terminal of the second NMOS transistor N2 is connected to the first output terminal. The ninth NMOS transistor receives an evaluation signal EVAL1 through a gate. A first terminal of the ninth transistor N9 is connected to a second terminal of the second NMOS transistor N2; and the second terminal of the ninth transistor N9 is connected to the ground voltage VSS.

A transmitter TX of the bus connector TL is connected between a ground voltage VSS and the global data bus GIO and includes two NMOS transistors N5 and N6. The fifth NMOS transistor N5 receives a first data TX1 through a gate; the sixth NMOS transistor N6 receives a first drive pulse DP1 through a gate.

The receiver QRX of the transfer unit QTRX is provided with two PMOS transistors P3 and P4, three NMOS transistors N3, N4, and N10. First terminals of the third PMOS transistor P3 and the fourth PMOS transistor P4 are connected to the power voltage VDD. A second terminal and a gate of the third PMOS transistor P3 are diode-connected to each other. A second terminal of the fourth PMOS transistor P4 is connected to a second output terminal. A first terminal of the third NMOS transistor N3 is connected with the second terminal of the third PMOS transistor P3 at node A2. A second terminal of the third NMOS transistor N3 is connected to the global data bus GIO. The third NMOS transistor N3 and the fourth NMOS transistor N4 receive the reference voltage VR through their gates. A first terminal of the fourth NMOS transistor N4 is connected to the second output terminal. The tenth NMOS transistor N10 receives a second evaluation signal EVAL2 through a gate. A first terminal of the tenth transistor N10 is connected to a second terminal of the fourth NMOS transistor N4; and a second terminal of the tenth transistor N10 is connected to the ground voltage VSS.

A transmitter QTX of the transfer unit QTRX is connected between the ground voltage VSS and the global data bus GIO and includes two NMOS transistors N7 and N8. The seventh NMOS transistor N7 receives a second data TX2 through a gate; the eighth NMOS transistor N8 receives a second drive pulse DP2 through a gate.

The global data bus GIO, through actually implemented with a long metal wire, can be modeled with a resister R and a capacitor C which have equivalent value with the metal wire.

When the read operation RD is performed, a data is transmitted between the transmitter TX of the bus connector TL and the receiver QRX of the data transfer unit QTRX through the global data bus GIO. Meanwhile, when the write operation WT is performed, the data is transmitted between the transmitter QTX of the data transfer unit QTRX and the receiver RX of the bus connector TL through the global data bus GIO.

Abovementioned the read and the write operations are performed in a way that the transmitters TX and QTX charge or discharge the global data bus GIO in response to the first and the second data TX1 and TX2 and, then, the receivers RX and QRX sense a status of the global data bus GIO.

Meanwhile, a switch is placed between the bus connector TL and the global data bus GIO. The switch connects the global data bus GIO to one of a redundant column and a normal column according to a test result.

FIG. 9 is a waveform showing the read operation of the circuit shown in FIG. 8.

The first drive pulse DP1, synchronized with a clock, makes the first data TX1, activated into a logic level 'H', loaded into the global data bus GIO. The second evaluation signal EVAL2 is activated into a logic level 'H' after a predetermined time has passed since the first drive pulse DP1 is activated to thereby evaluate the first data TX1 loaded into the global data bus GIO. Herein, the predetermined time is a time margin for charging or discharging the global data bus GIO.

If first data TX1 inputted to the transmitter TX of the bus connector TL and the first drive pulse DP1 are the logic level 'H', the fifth and sixth NMOS transistors N5 and N6 are turned on and, therefore, the global data bus GIO is discharged. After a voltage level of the node A2 in the receiver QRX of the data transfer unit QTRX becomes lower than a threshold voltage VTH of the PMOS transistor, the third and fourth PMOS transistors P3 and P4 are turned on and, thus, an output DATA2 from the receiver QRX of the data transfer unit QTRX becomes a logic level 'H'. That is, the first data TX1 having the logic level 'H' is correctly transmitted through the global data bus GIO.

Meanwhile, because a size of the fourth PMOS transistor P4 is relatively larger than that of the tenth NMOS transistor N10, the output signal DATA2 does not change into a logic level 'L' but shows a little fluctuation when the second evaluation signal EVAL2 is the logic level 'H'.

If the first data TX1 with a logic level 'L' is inputted to the transmitter TX of the bus connector TL and the first drive pulse DP1 is the logic level 'H', the global data GIO maintains a charged state. Therefore, the node A2 in the data transfer unit QTRX is not discharged and, subsequently, the fourth PMOS transistor P4 cannot drive the second output terminal into a logic level 'H'. Then, when the second evaluation signal EVAL2 becomes the logic level 'H', the tenth NMOS transistor N10 is turned on and, therefore, the second output terminal is discharged. Thus, the output signal DATA2 of outputted from the data transfer unit QTRX is a logic level 'L'. That is, the first data TX1 having the logic level 'L' is correctly transmitted through the global data bus GIO.

Referring to FIG. 9, the first drive pulse DP1 is activated four times as the logic level 'H'. Namely, the first data TX1 is transmitted four times. In other words, the global data bus GIO is discharged only while the drive pulses DP1 and DP2 are in the logic level 'H'. The global bus GIO is charged through the receiver RX in the bus connector TL and the receiver QRX in the data transfer unit QTRX. Because the first and the third NMOS transistors N1 and N3 receive the reference voltage VR and, therefore, are unstably turned on, the global data bus GIO is charged by the receivers RX and QRX during discharged in response to the drive pulses DP1 and DP2. Therefore, sizes of the NMOS transistors N5, N6, N7, and N8 in the transmitters TX and QTX, which perform a discharge of the global data bus GIO, are sufficiently large to compensate a current charge caused by the first and the third NMOS transistors N1 and N3.

FIG. 10 is a block diagram showing a discharge procedure of the first global data bus GIO_LU in the 256M multi-port DRAM shown in FIG. 1.

As shown, the first global data bus GIO_LU of the first quadrant in the 256M multi-port DRAM is connected to the four banks BANK0, BANK2, BANK4, and BANK6, two ports PORT0 and PORT2, and the first global data bus connector PR_U. In each of the banks, a switch NMOS transistor exists between the bus connector TL and the global data bus GIO. The switch NMOS transistor is used as the switch shown in FIG. 8. The switch NMOS transistors in each bank BANK0, BANK2, BANK4, and BANK6 respectively receive switch signals SW<0>, SW<2>, SW<4>, and SW<6> through each gate. The switch signals SW<0>, SW<2>, SW<4>, and SW<6> are always maintained a logic level 'H' and, therefore, the switch NMOS transistors are always turned on to thereby be connected with the first global data bus GIO_LU.

In order to transmit a data through the global data bus GIO, every block connected to the global data bus GIO should include a transmitter and a receiver coupled with the global data bus GIO. That is, the bus connector TL and the data transfer unit QTRX include the receivers RX and QRX and the transmitters TX and QTX, respectively. Though not illustrated, the first global data bus connector PR_U also includes a receiver and a transmitter.

As abovementioned, the receivers RX and QRX sense a data according to a state of the global data bus GIO and are served as a charge source for charging the global data bus GIO.

Referring to FIG. 10, the third bank BANK2 transmits a data; the third port PORT2 receives the data. In this case, the global data bus GIO is discharged by the transmitter TX in the third bank BANK2 while a read drive pulse RDP<2>, activated when the read operation, is in a logic level 'H'. A period when the read drive pulse RDP<2> is in the logic level 'H' is determined by an operational speed of the memory device. If the operation speed of the memory device is very high, the sector may be a several nano-seconds (ns). That is, the transmitter TX in the third bank BANK2 should discharge the first global data bus GIO_LU within very short time.

Meanwhile, because the receivers RX and QRX charge the global data bus GIO even while the transmitter TX and QTX discharge the global data bus GIO, it is hard for the transmitter TX of the third bank BANK2 to effectively discharge the global data bus GIO. The abovementioned problem also occurs at not only the write operation but also the read operation.

In order to solve the abovementioned problem, it is required that sizes of the NMOS transistors N5 to N8 in the transmitters TX and QTX are large to thereby discharge a sufficiently large amount of an electric charge of a short time.

However, as the size of the NMOS transistor is increased, a current consumption and a layout size are also increased. The problems caused by increasing the size of the transistor are deepened when the number of receivers connected to a single global data bus GIO is grown. Further, the problem leads a difficulty to a routing operation of the global data bus GIO.

SUMMARY OF THE INVENTION

It is, therefore, an object of the present invention to provide a multi-port memory device for improving a global data drive efficiency by turning off the switches which do not discharge a global data bus.

In accordance with an aspect of the present invention, there is provided a multi-port memory device including a global data bus containing a plurality of bus lines; a plurality of banks including a current sensing transmitter and a current sensing receiver, the transmitter and the receiver for exchanging a data with the global data bus; a plurality of ports including the transmitter and the receiver; a plurality of switches provided between the transmitters and the receivers in each of the banks and the bus line of the global data bus, the switch for selectively connecting the corresponding transmitter and the corresponding receiver with the global data bus; and a switching controller for generating a switch signal in response to a drive pulse and a data signal inputted to the transmitter, wherein the switch signal turns off the switches corresponding to the banks which are not discharging the global data bus.

In accordance with another aspect of the present invention, there is provided a multi-port memory device including a global data bus containing a plurality of bus lines; a plurality of banks including a current sensing transmitter and a current sensing receiver, the transmitter and the receiver for exchanging a data with the global data bus; a plurality of ports including the transmitter and the receiver; a plurality of switches provided between the transmitters and the receivers in each of the banks and the bus line of the global data bus, the switch for selectively connecting the corresponding transmitter and the corresponding receiver with the global data bus; a discharge signal generator for generating a discharge signal corresponding to each of the banks in response to a drive pulse and a data signal corresponding to each of the banks; and a switch signal generator for generating a switch signal by logically combining the discharge signal, wherein the switch signal turns off the switches corresponding to the banks which are not discharging the global data bus.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a multi-port semiconductor memory device in accordance with the present invention will be described in detail referring to the accompanying drawings.

Figure 11:
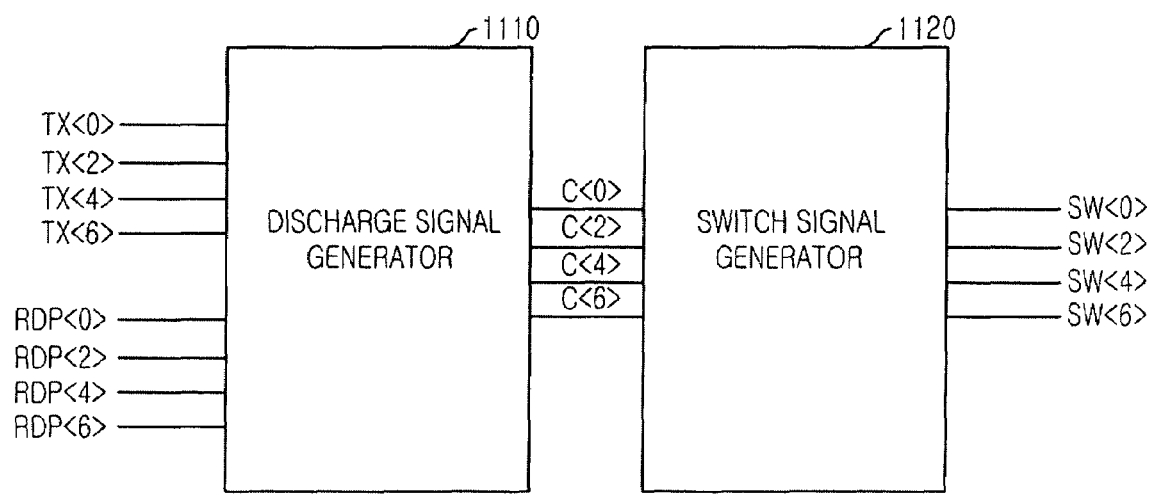
FIG. 11 is a block diagram describing a switch control logic of a 256M multi-port DRAM in accordance with a preferred embodiment of the present invention.

FIG. 11 is a block diagram describing a switch control logic of a 256M multi-port DRAM in accordance with a preferred embodiment of the present invention.

Figure 1:
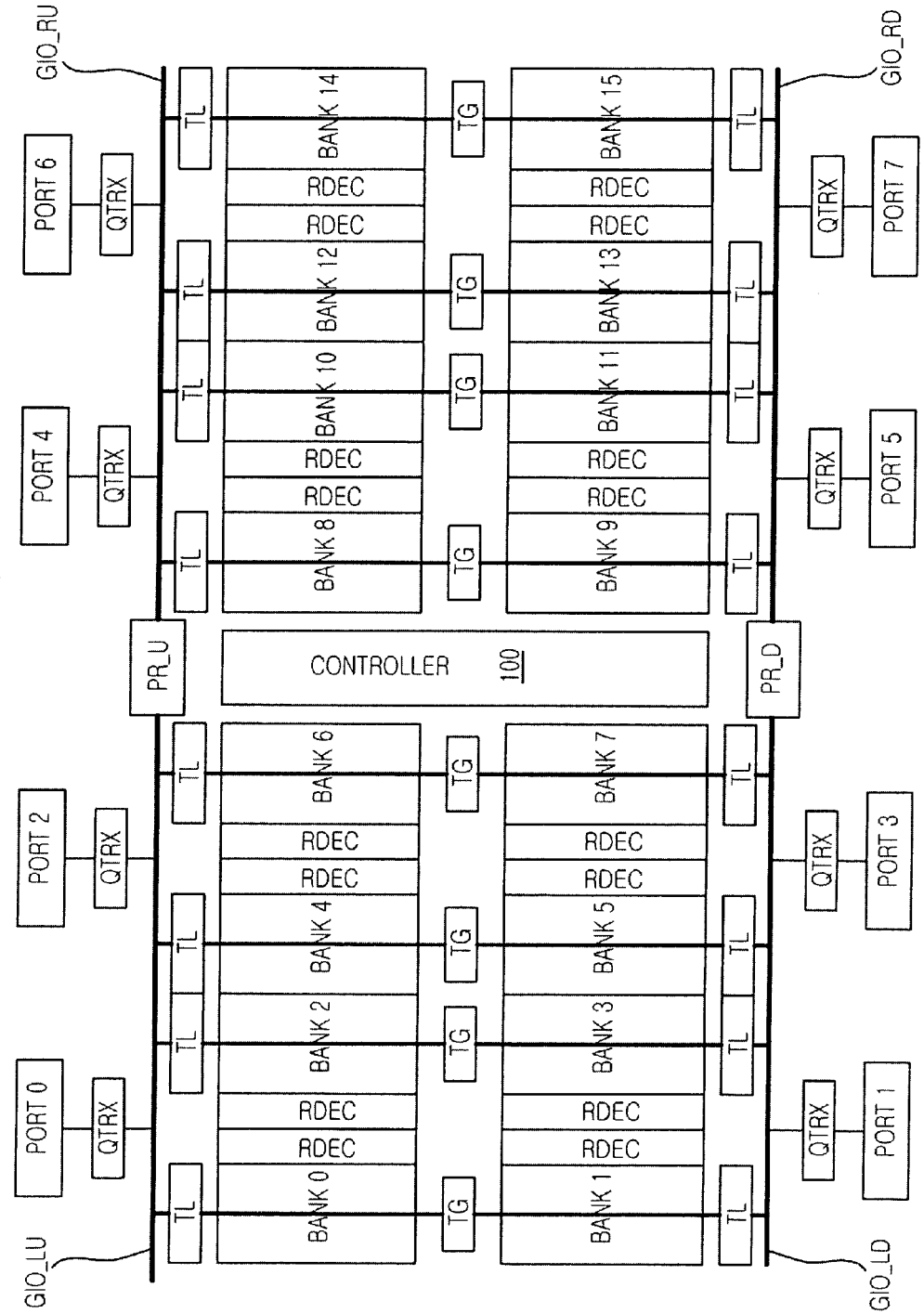
FIG. 1 is a block diagram describing a 256M multi-port memory device disclosed in a commonly owned copending application, U.S. Ser. No. 10/750,156, filed on Dec. 31, 2003, entitled "MULTI-PORT MEMORY DEVICE", which is incorporated herein by reference.
Figure 2:
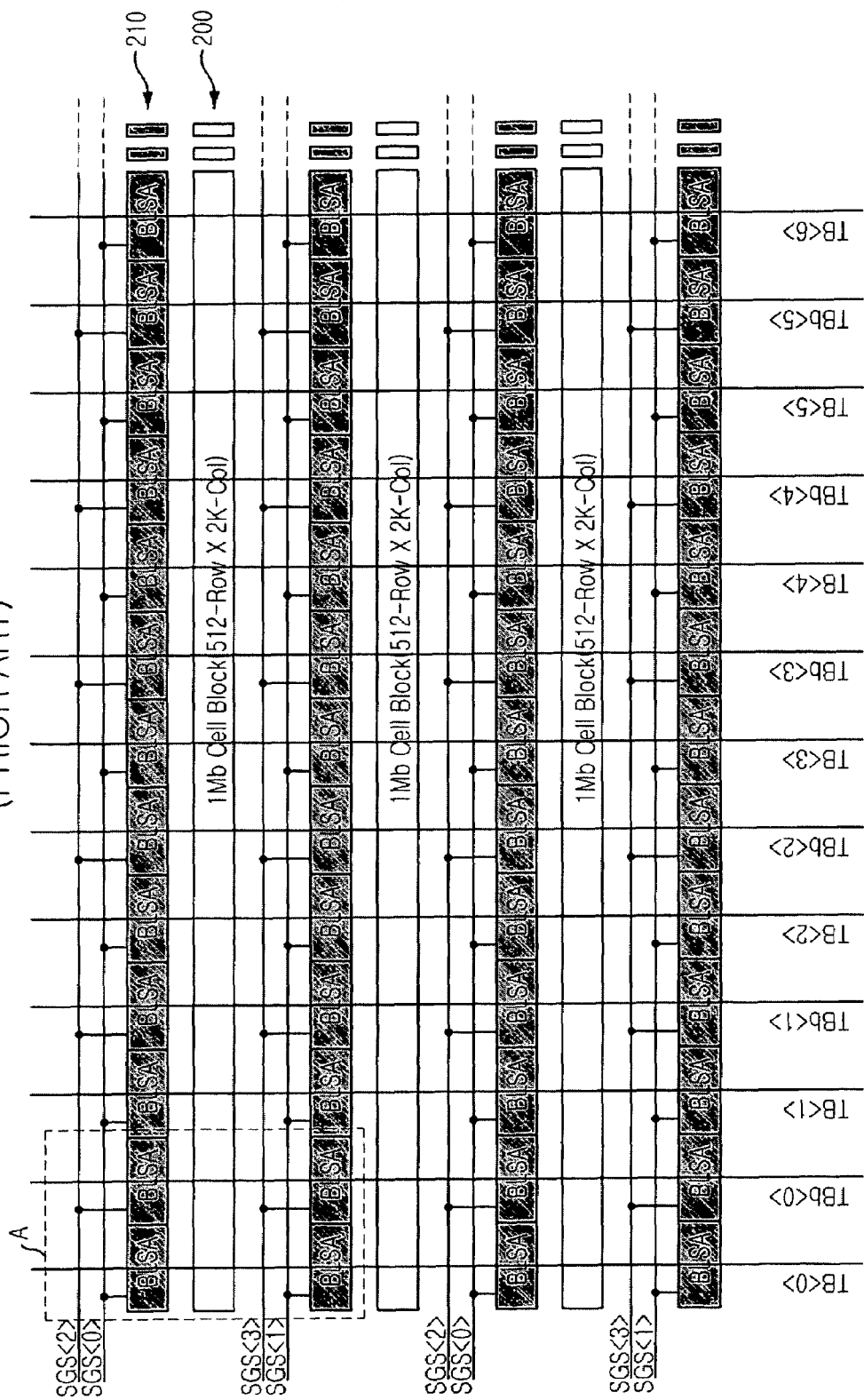
FIG. 2 is a diagram showing a relationship between a transfer bus and a segment of the conventional 256M multi-port DRAM shown in FIG. 1.
Figure 3A:
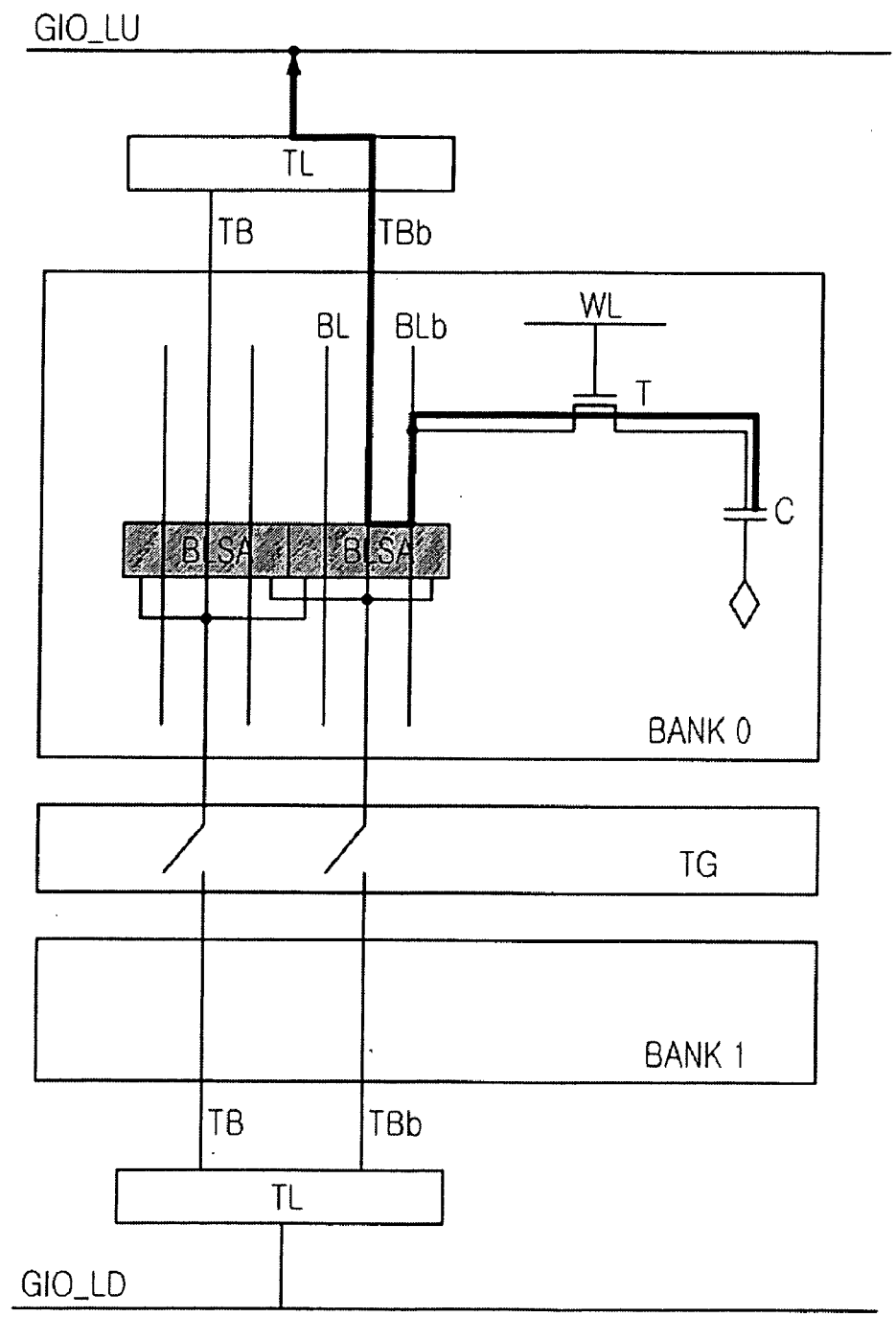
FIGS. 3A and 3B are block diagrams describing a normal read path and a normal write path of the conventional 256M multi-port DRAM, respectively.
Figure 3B:
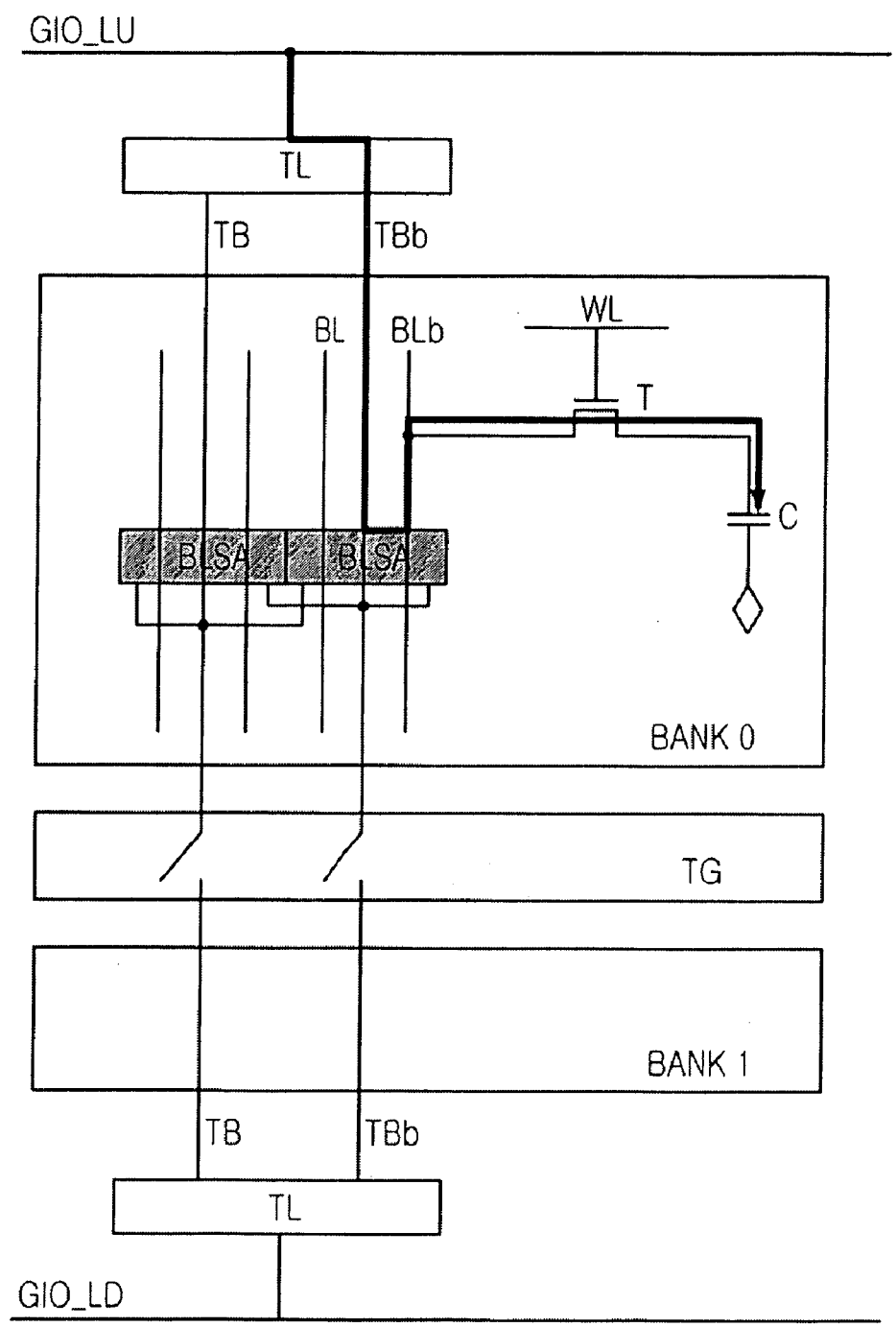
Figure 4A:
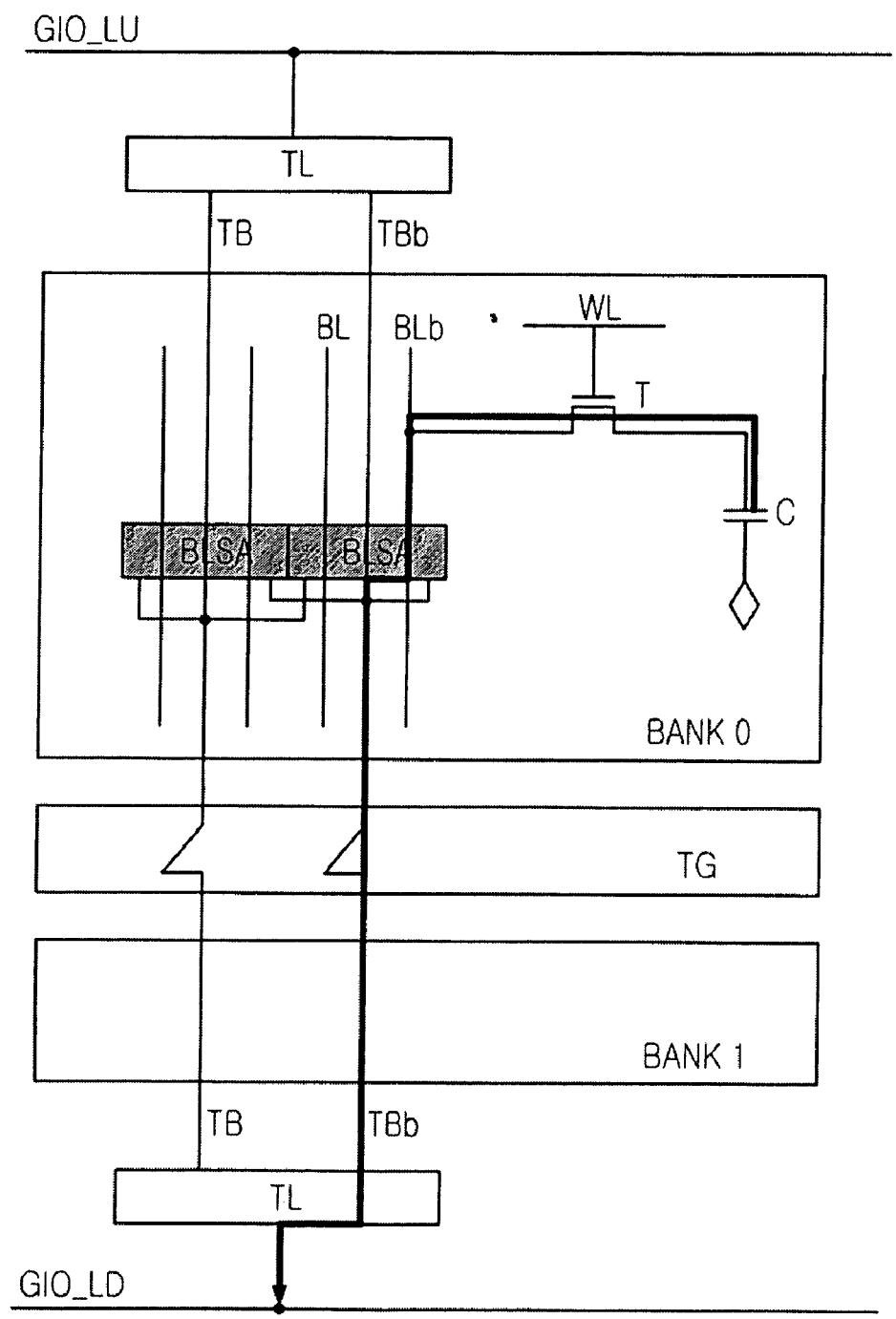
FIGS. 4A and 4B are block diagrams describing a cross read path and a cross write path of the conventional 256M multi-port DRAM, respectively.
Figure 4B:
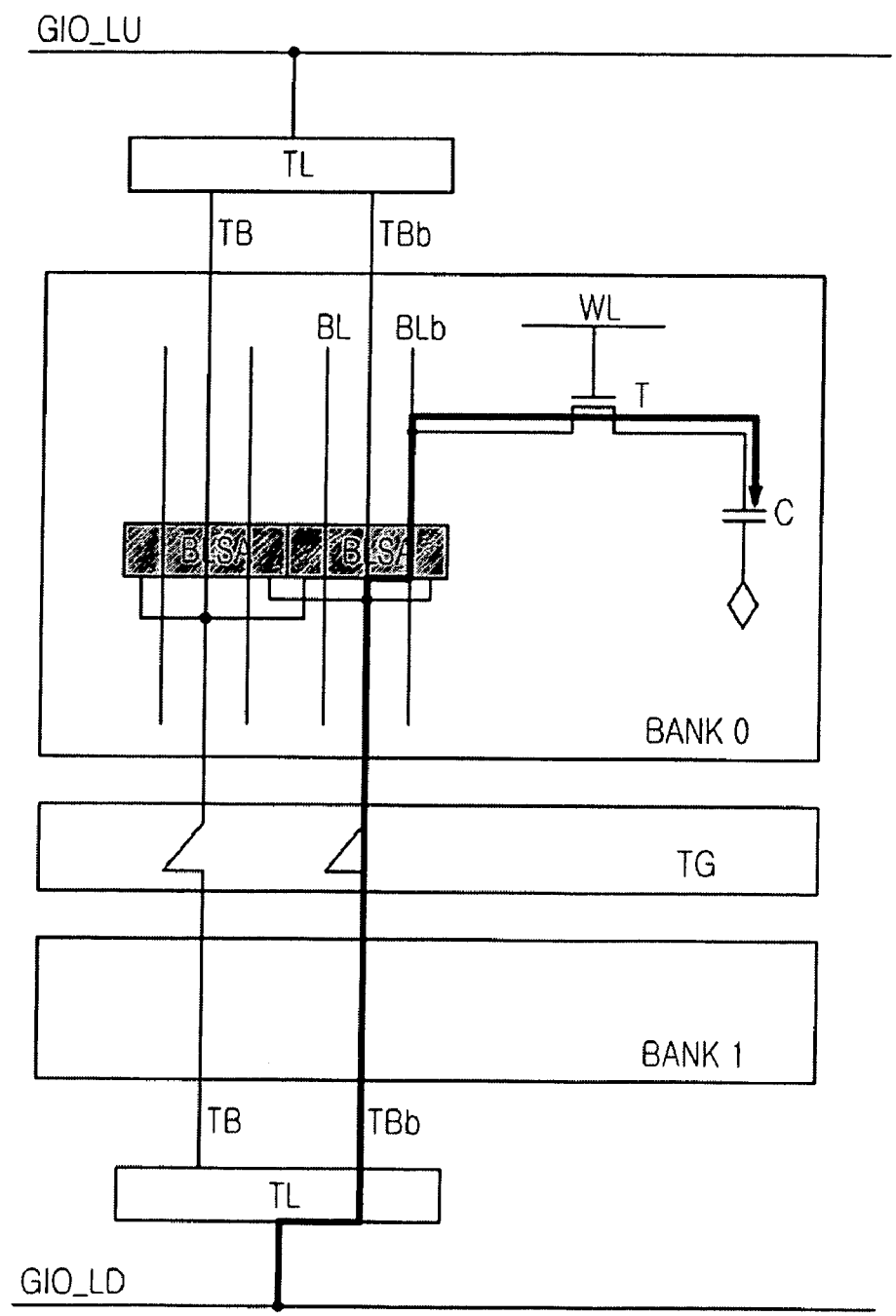
Figure 5:
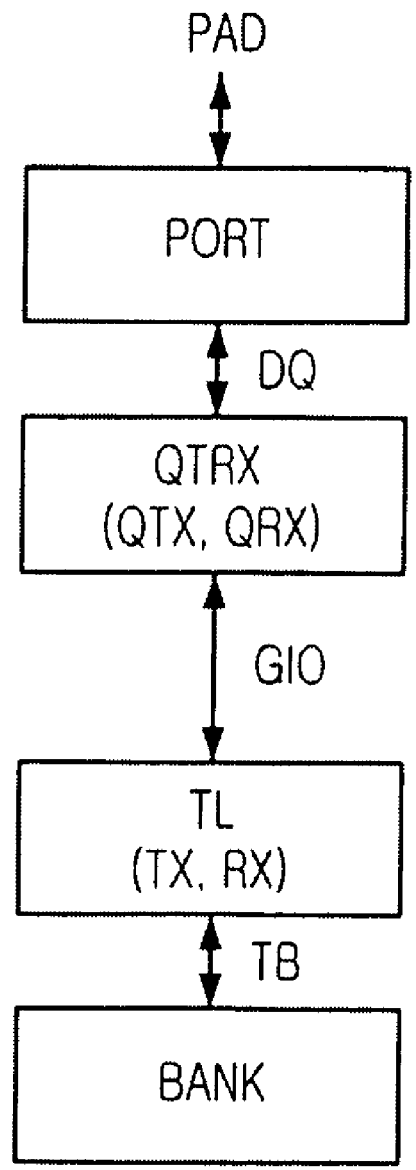
FIG. 5 is a diagram showing a data transmitting structure of the 256M multi-port DRAM shown in FIG. 1.
Figure 6:
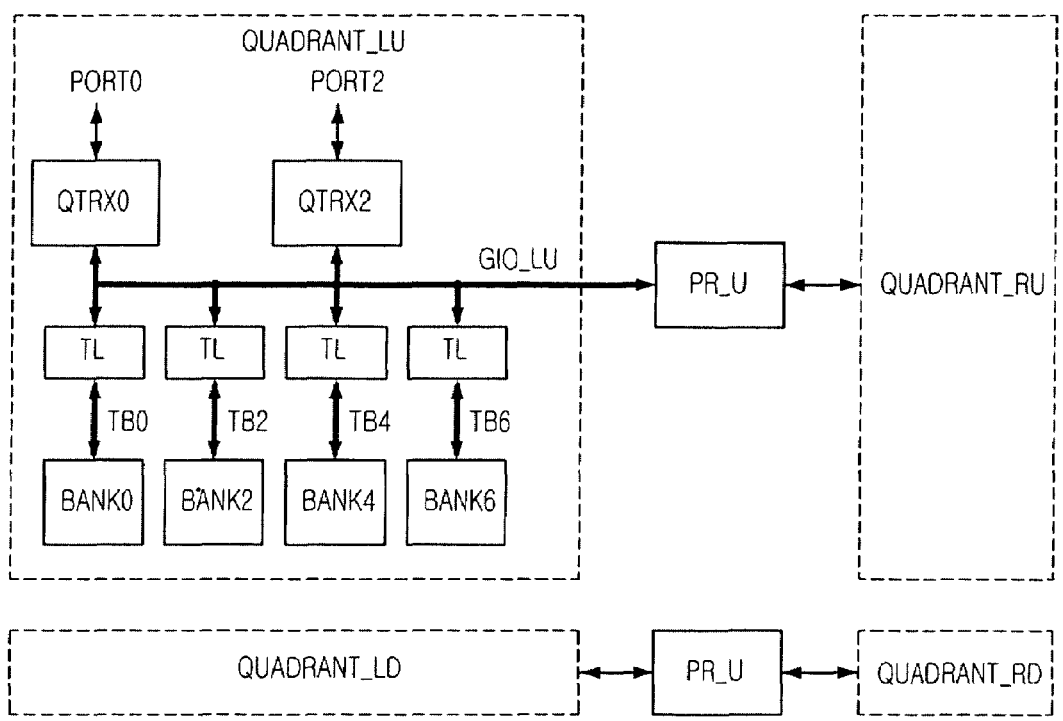
FIG. 6 is a block diagram describing a structure of the global data bus GIO shown in FIG. 5.
Figure 7:
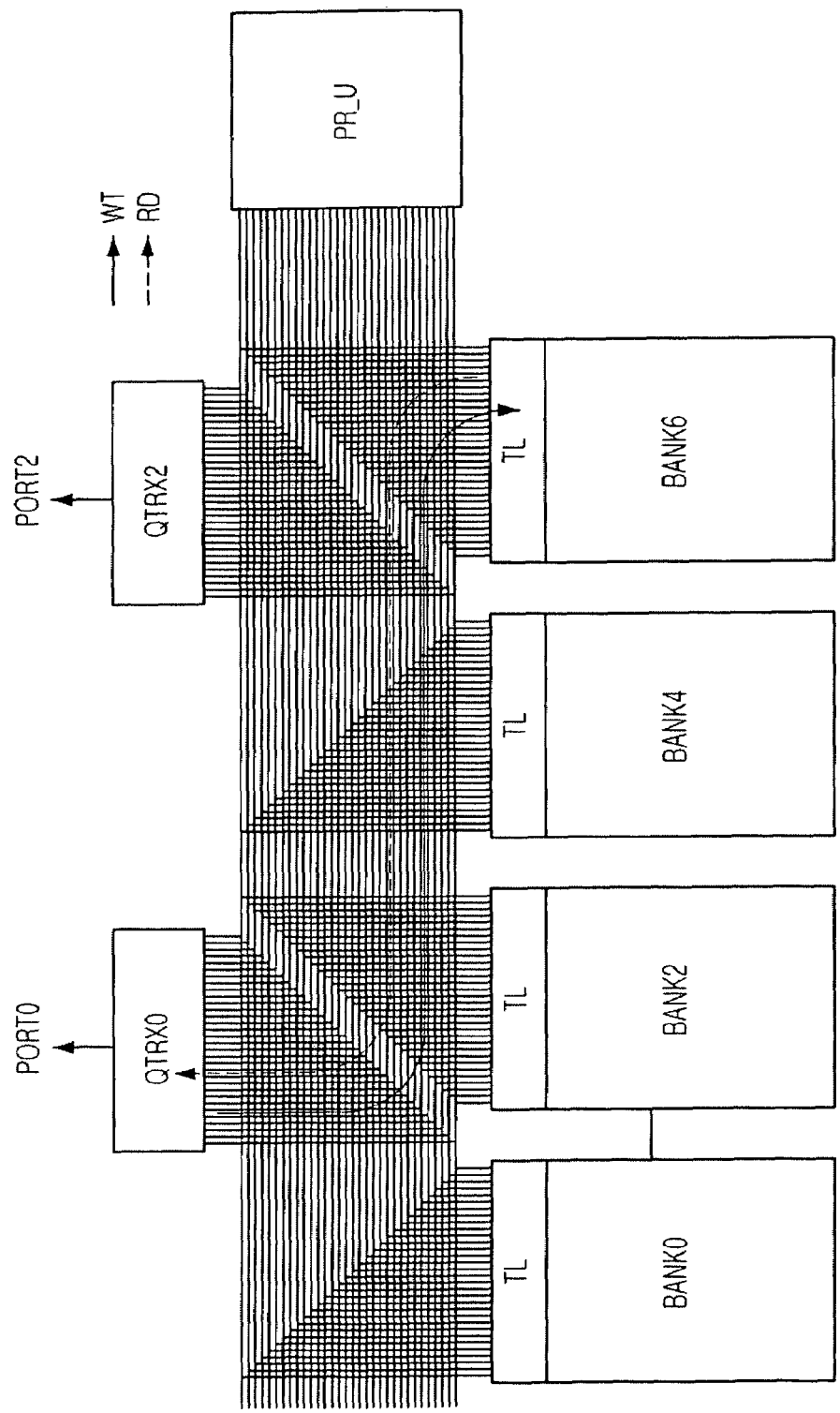
FIG. 7 is a block diagram showing a worst read case and a worst write case of the 256M multi-port DRAM shown in FIG. 1.
Figure 8:
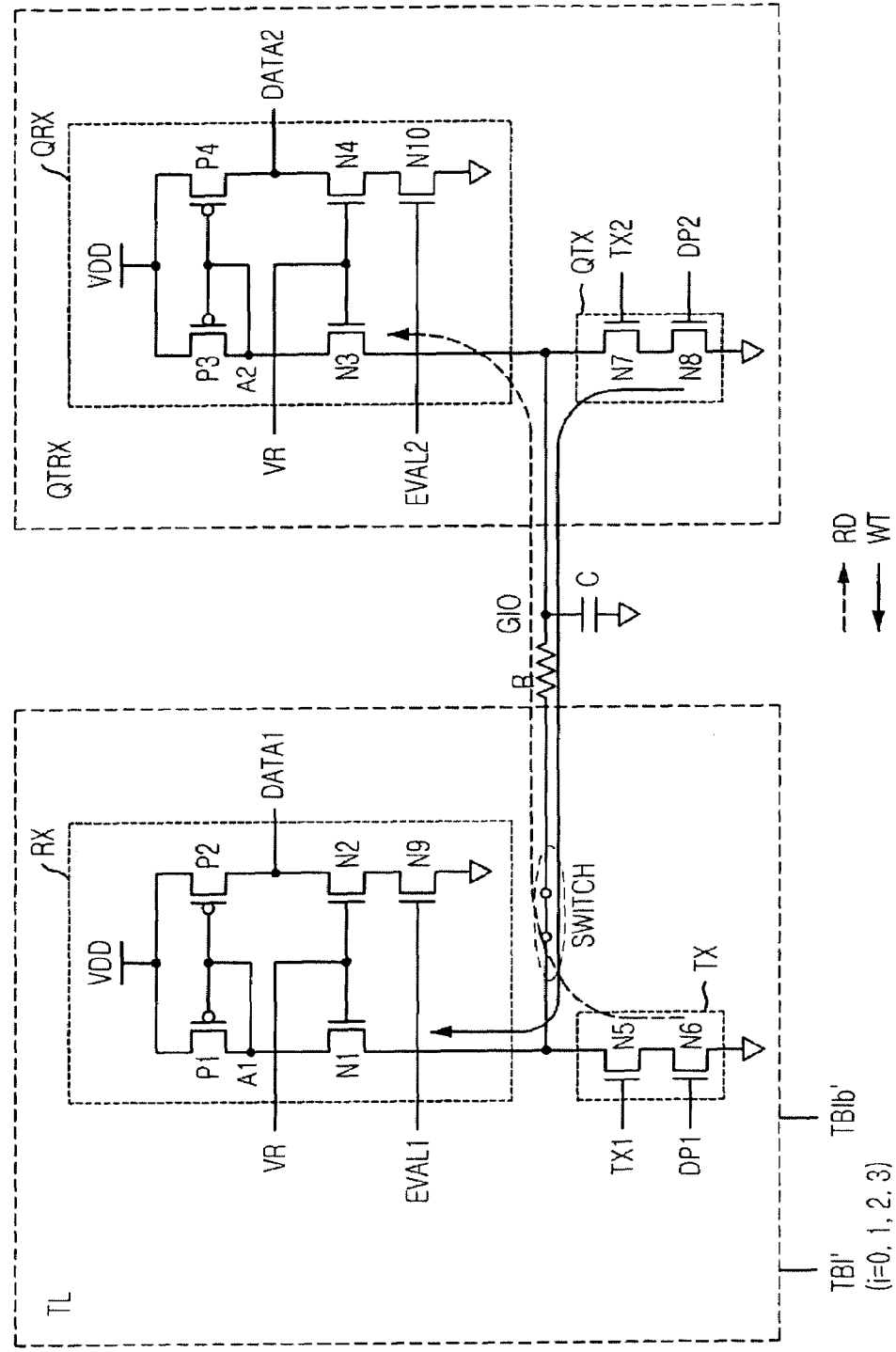
FIG. 8 is a block diagram describing a data transfer unit QTRX and bus connector TL disclosed in a commonly owned copending application, U.S. Ser. No. 10/788,704, filed on Feb. 27, 2004, entitled "SEMICONDUCTOR MEMORY DEVICE", which is incorporated herein by reference.
Figure 9:
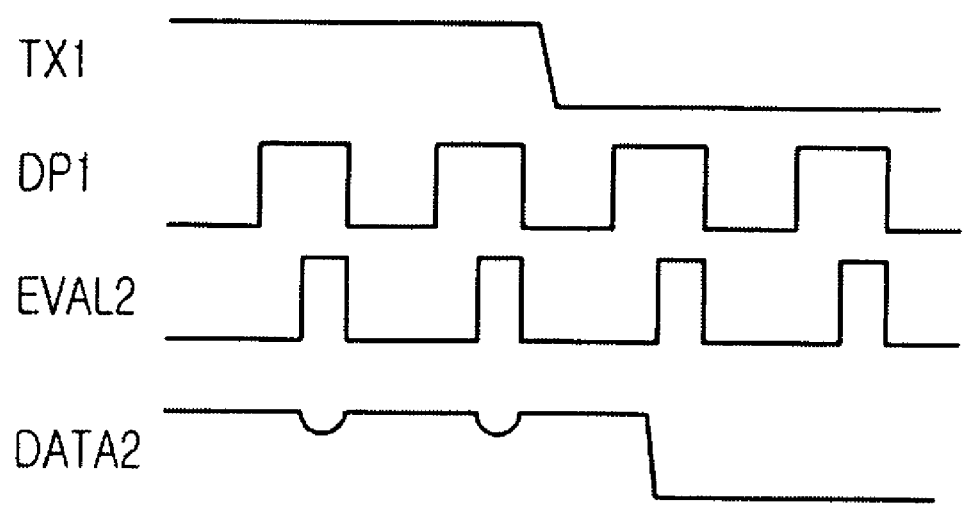
FIG. 9 is a waveform showing a read operation of the circuit shown in FIG. 8.
Figure 10:
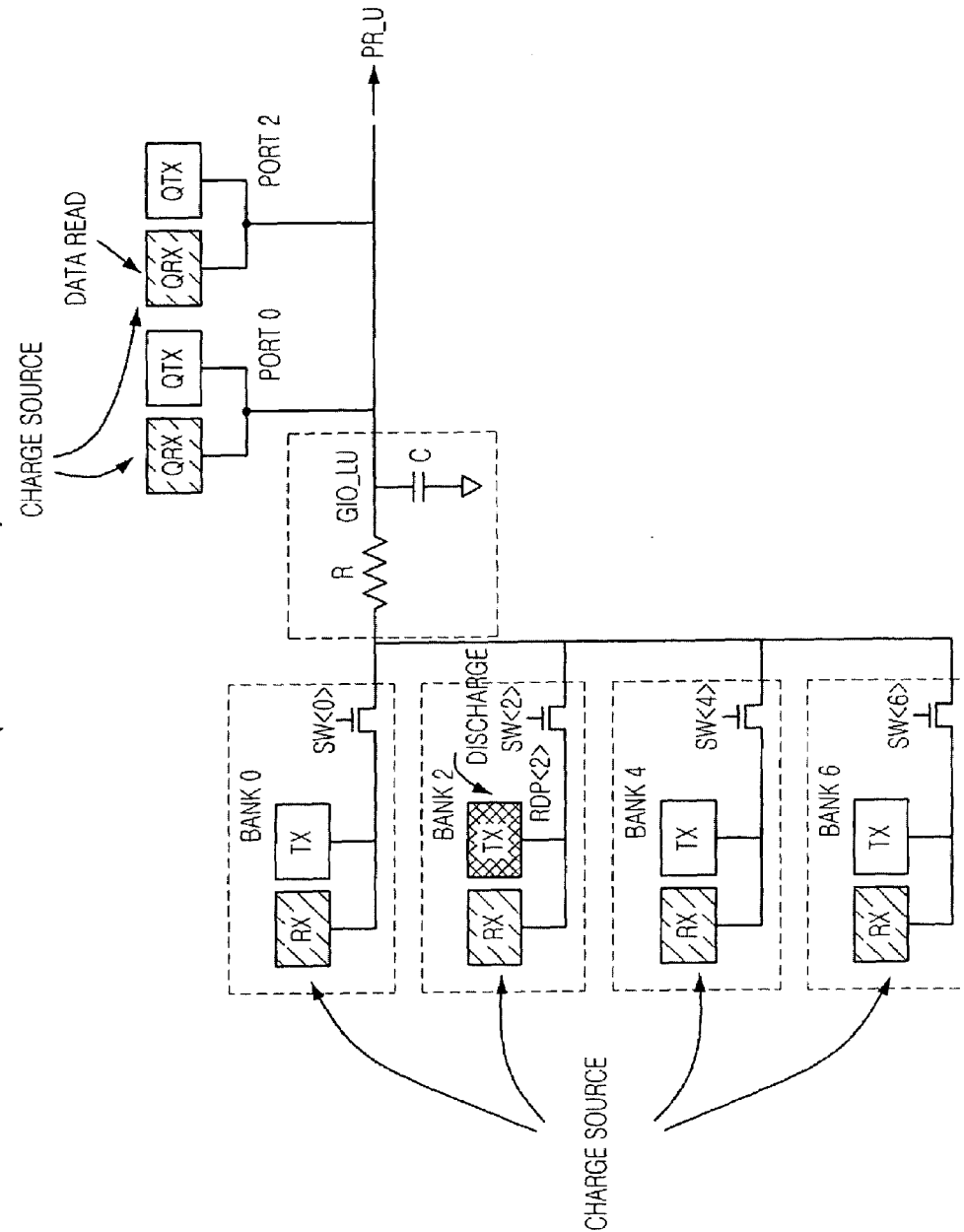
FIG. 10 is a block diagram showing a discharge procedure of the first global data bus GIO_LU in the 256M multi-port DRAM shown in FIG. 1.

As shown, the switch control logic generates switch signals SW<0>, SW<2>, SW<4>, and SW<6> for controlling switch NMOS transistors shown in FIG. 10.

Meanwhile, the switch control logic includes a discharge signal generator 1110 and a switch signal generator 1120. The discharge signal generator 1110 receives drive pulses DP<0>, DP<2>, DP<4>, and DP<6> and data signals TX<0>, TX<2>, TX<4>, and TX<6> corresponding to banks BANK0, BANK2, BANK4, and BANK6 to thereby output discharge signals C<0>, C<2>, C<4>, and C<6>. The switch signal generator 1120 logically combines the discharge signals C<0>, C<2>, C<4>, and C<6> to thereby generates the switch signals SW<0>, SW<2>, SW<4>, and SW<6> for turning off the switch NMOS transistors in the banks which does not actually discharge the first data bus GIO_LU.

Figure 12:
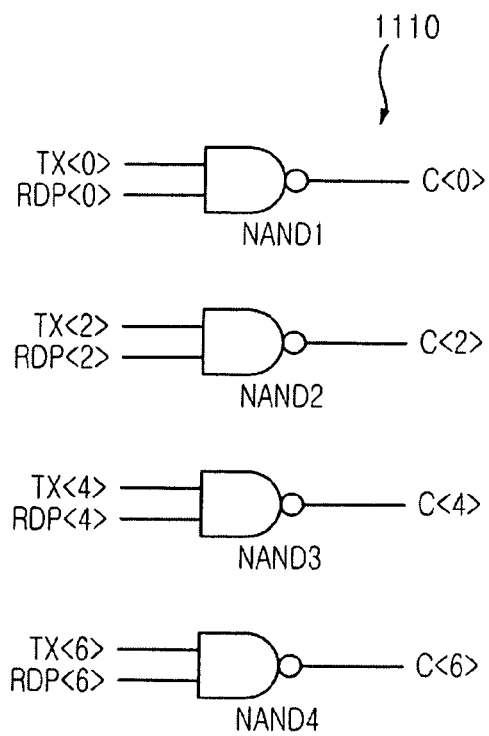
FIG. 12 is a diagram depicting a discharge signal generator in accordance with an exemplary logic implementation.

FIG. 12 is a diagram depicting the discharge signal generator 1110 in accordance with an exemplary embodiment of the present invention.

As shown, the discharge signal generator 1110 is provided with four NAND gates NAND1 to NAND4. Each of the four NAND gates NAND1 to NAND4 respectively receives a corresponding data signal TX and drive pulse DP to thereby output the discharge signal C. For example, the first NAND gate NAND1 receives a first data signal TX<0> and a first drive pulse DP<0> to thereby output the first discharge signal C<0>.

Figure 13:
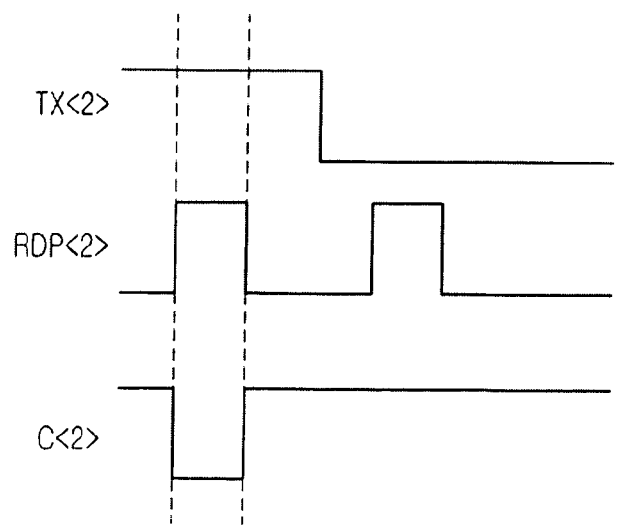
FIG. 13 is a waveform demonstrating the read operation performed between the third bank BANK2 and the third port PORT2.

FIG. 13 is a waveform demonstrating the read operation performed between the third bank BANK2 and the third port PORT2.

First, the discharge signals C<0>, C<2>, C<4>, and C<6> are a logic level 'H' before the read command corresponding to the banks, i.e., BANK0, BANK2, BANK4, and BANK6, connected to the first global data bus GIO_LU, is inputted.

After the read command corresponding to the third bank BANK2 is inputted, the third drive pulse DP<2> is activated. If the third data TX<2> is a logic level 'H' during an activation sector of the third drive pulse DP<2>, the third discharge signal C<2> corresponding to the third bank BANK2 becomes a logic level 'L'. While the third discharge signal C<2> has the logic level 'L', the other discharge signals C<0>, C<4>, and C<6> keep a logic level 'H'.

That is, the discharge signal gives information about which bank discharges the global data bus GIO and when the global data bus GIO is discharged. For example, the discharge signals C<0>, C<2>, C<4>, and C<6> give the information which bank among the banks, i.e., BANK0, BANK2, BANK4, and BANK6, connected to the first global data bus GIO_LU discharges the first global data bus GIO_LU.

Figure 14:
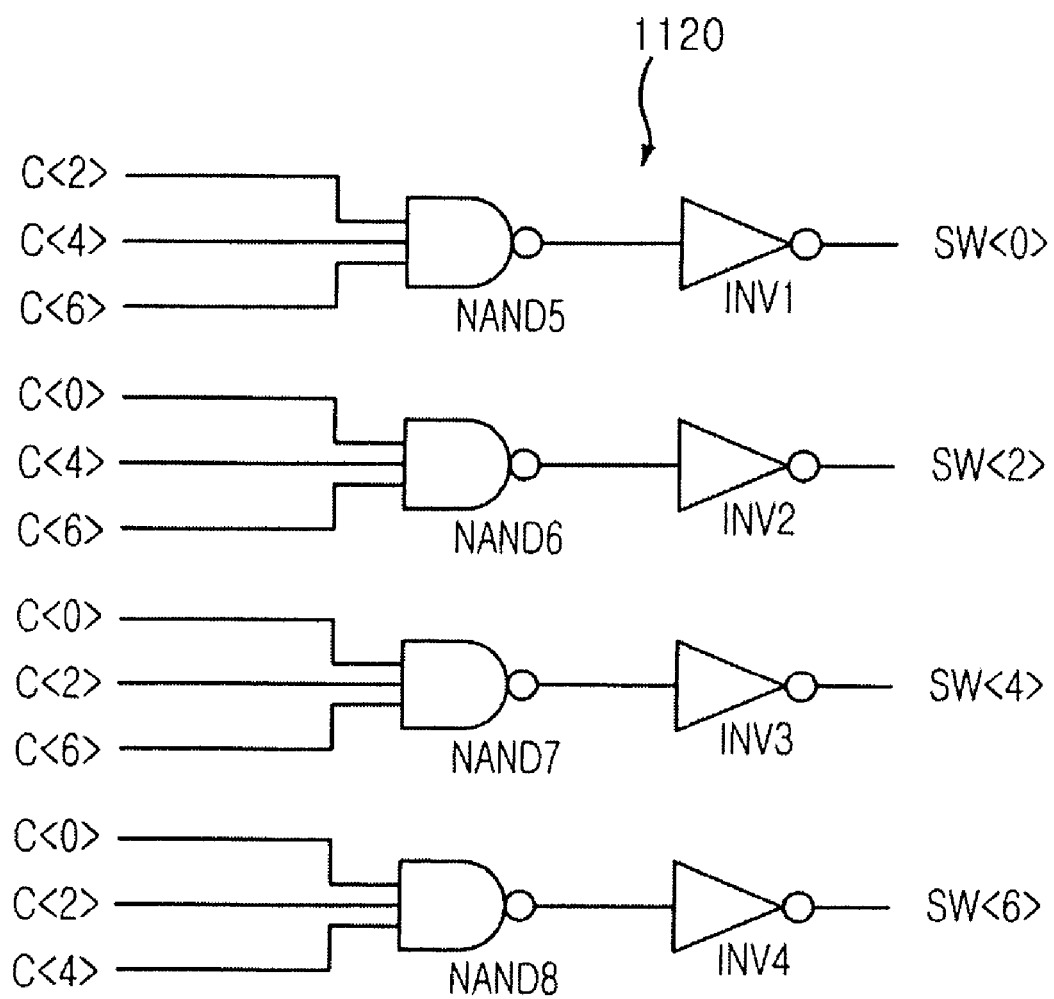
FIG. 14 is a diagram depicting a switch signal generator in accordance with an exemplary embodiment of the present invention.

FIG. 14 is a diagram depicting the switch signal generator 1120 in accordance with an exemplary embodiment of the present invention.

As shown, the switch signal generator 1120 includes four NAND gates NAND5 to NAND8 and four inverters INV1 to INV4.

Each of the four NAND gates NAND5 to NAND8 receives three discharge signals out of the discharge signals C<0>, C<2>, C<4>, and C<6>. Further, every three inputs inputted to the NAND gates NAND5 to NAND8 has a different combination. That is, the NAND gate, among the NAND5 to NAND8, for generating the switch signal receives the three discharge signals except for the discharge signal of the bank corresponding to the switch signal. For example, the sixth NAND gate NAND6 for generating the third switch signal SW<2> receives the discharge signals C<0>, C<4>, and C<6>. However, the third discharge signal C<2> corresponding to the third bank BANK2 is not inputted to the sixth NAND gate NAND6.

The inverters INV1 to INV4 respectively receives outputs of the NAND gates NAND5 to NAND8 to thereby output switch signals SW<0>, SW<2>, SW<4>, and SW<6>. For example, the fifth NAND gate NAND5 receives three discharge signals, i.e., C<2>, C<4>, and C<6>, and, then, the first inverter INV1 receives the output of the fifth NAND gate NAND5 to thereby output the first switch signal SW<0>.

Figure 15:
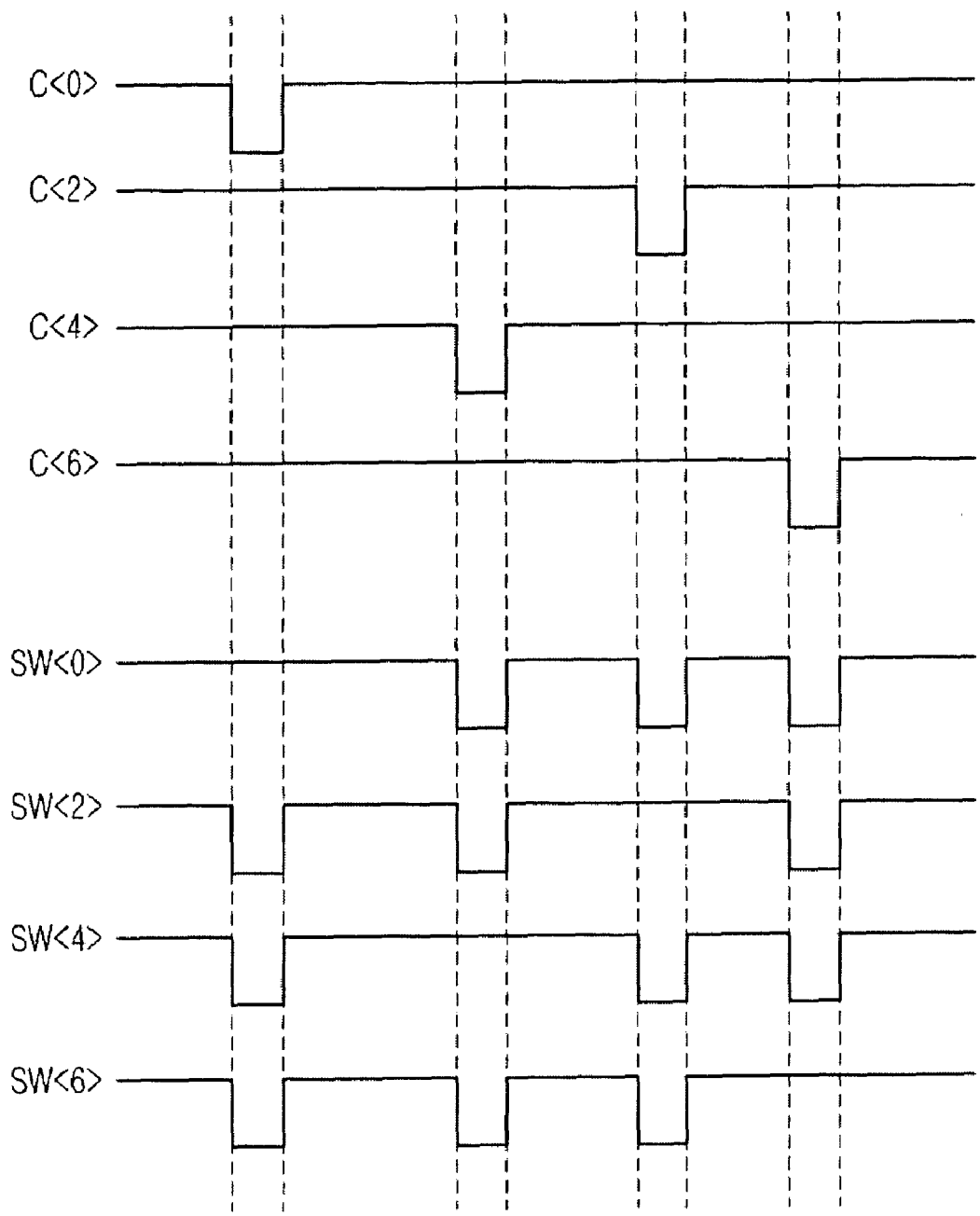
FIG. 15 is a wave form demonstrating an operation of a switch signal generator shown in FIG. 11.

FIG. 15 is a waveform demonstrating an operation of the switch signal generator 1120 shown in FIG. 11.

As abovementioned, the discharge signals C<0>, C<2>, C<4>, and C<6> have initially logic level 'H' before the read command corresponding to the banks connected to the first global data bus GIO_LU, i.e., BANK0, BANK2, BANK4, and BANK6, is inputted. Therefore, the switch signals SW<0>, SW<2>, SW<4>, and SW<6> are logic level 'H'. The switch NMOS transistors in the banks BANK0, BANK2, BANK4, and BANK6 are turned on in response to the switch signals SW<0>, SW<2>, SW<4>, and SW<6>.

After the read command corresponding to the first bank BANK0 is inputted, the first drive pulse DP<0> is activated into a logic level 'H'. When the first data TX<0> becomes a logic level 'H' during an activation sector of the first drive pulse DP1, the first discharge signal C<0> becomes a logic level 'L'. Meanwhile, the other discharge signals C<2>, C<4>, and C<6> keep holds a logic level 'H'.

As referring to FIG. 14, the switch signals SW<0>, SW<2>, SW<4>, and SW<6> are generated by logically multiplying three discharge signals except the discharge signal corresponding to its own bank. That is, the first switching signal SW<O> is generated from the discharge signals C<2>, C<4>, and C<6>. Consequently, only the switch NMOS transistor of the first bank BANK0, actually discharging the first global data bus GIO_LU, is turned on during a discharge sector and, further, the other switch NMOS transistors are turned off.

After the discharge sector is over, the all discharge signals C<0>, C<2>, C<4>, and C<6> recover the logic level 'H' and, therefore, the all switching signals SW<0>, SW<2>, SW<4>, and SW<6> also recover the logic level 'H'. Then, the switch NMOS transistors corresponding to the banks BANK0, BANK2, BANK4, and BANK6 to thereby charge the first global data bus GIO_LU.

At the discharge sectors hereafter, only the switch NMOS transistor which actually discharges the global data bus GIO, is turned on and the other switch NMOS transistors are turned off.

In the abovementioned embodiment, because only the switch NMOS transistor of the bank, which actually discharges the global data bus GIO, is connected to the global data bus GIO, there exists only one charge source. Therefore, a sufficient charge can be achieved without increasing the size of the transistors in the transmitters TX and QTX.

In another embodiment, the present invention also can be applied to other multi-port memory devices having a RAM cell such as a static random access memory (SRAM). Further, the number of the multi-port memory device and the banks can be varied according to a capacity of the memory device and a chip size. Still further, transistors and logic gates used in the abovementioned embodiment can be changed according to a polarity of signals.

The present invention provides a multi-port memory device having a global data bus which is driven by sensing a current, the multi-port memory device is for reducing a power consumption by turning off the transistors which does not discharge the global data bus GIO, reducing a size of the transistor performing a discharge operation, and thereby reducing a chip size.

The present application contains subject matter related to Korean patent application No. 2005-27400, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A multi-port memory device, comprising:
   a global data bus;
   a plurality of banks, each including a first transmitter and a first receiver, the transmitter and the receiver for each bank exchanging a data with the global data bus;
   a plurality of ports, each including a second transmitter and a second receiver for exchanging data with the global data bus;
   a plurality of switches, each provided between the transmitter and the receiver in each bank and the global data bus for selectively connecting the transmitter and the receiver of the bank with the global data bus; and
   a switching controller for generating a switch signal for each of the switches in response to a drive pulse and a data signal at the input of the first transmitter of the bank,
   wherein the switch signal turns on/off the switches corresponding to the banks and when a first transmitter of a bank transmits data to the global data bus, a switch corresponding to the bank is turned on and switches corresponding to the other banks are turned off.

2. The multi-port memory device as recited in claim 1, wherein each of the transmitters includes first and second NMOS transistors serially connected to each other between the global data bus and a ground voltage, the first and the second NMOS transistors respectively receiving the drive pulse and the data signal through their corresponding gates.

3. The multi-port memory device as recited in claim 2, wherein each of the receivers includes:
   a first PMOS transistor whose first terminal is connected to a power voltage and whose second terminal and gate are diode-connected with each other;
   a second PMOS transistor whose first terminal is connected to the power voltage and whose second terminal is connected to an output terminal;
   a third NMOS transistor whose first terminal is connected to the second terminal of the first PMOS transistor, whose second terminal is connected to the global data bus, and whose gate receives a reference voltage;
   a fourth NMOS transistor whose first terminal is connected to the output terminal and whose gate receives the reference voltage; and
   a fifth NMOS transistor whose first terminal is connected to a second terminal of the fourth NMOS transistor, whose second terminal is connected to the ground voltage, and whose gate receives an evaluation signal.

4. A multi-port memory device, comprising:
   a global data bus;
   a plurality of banks, each including a first transmitter and a first receiver, the transmitter and the receiver exchanging data with the global data bus;
   a plurality of ports, each including a second transmitter and a second receiver for exchanging data with the global data bus;
   a plurality of switches, each provided between the first transmitter and the first receiver in each of the banks and the global data bus for selectively connecting the corresponding first transmitter and the corresponding first receiver with the global data bus;
   a discharge signal generator for generating a discharge signal corresponding to each of the banks in response to a drive pulse and a data signal corresponding to each of the banks; and
   a switch signal generator for generating a switch signal based on the discharge signal, wherein the switch signal turns on/off the switches corresponding to the banks and when a first transmitter of a bank transmits data to the global data bus, a switch corresponding to the bank is turned on and switches corresponding to the other banks are turned off.

5. The multi-port memory device as recited in claim 4, wherein each of the transmitters includes first and second NMOS transistors serially connected with each other between the global data bus and a ground voltage, the first and the second NMOS transistors respectively receiving the drive pulse and the data signal through their corresponding gates.

6. The multi-port memory device as recited in claim 5, wherein each of the receivers includes:
   a first PMOS transistor whose first terminal is connected to a power voltage and whose second terminal and gate are diode-connected each other;
   a second PMOS transistor whose first terminal is connected to the power voltage and whose second terminal is connected to an output terminal;
   a third NMOS transistor whose first terminal is connected to the second terminal of the first PMOS transistor, whose second terminal is connected to the global data bus, and whose gate receives a reference voltage;
   a fourth NMOS transistor whose first terminal is connected to the output terminal and whose gate receives the reference voltage; and
   a fifth NMOS transistor whose first terminal is connected to a second terminal of the fourth NMOS transistor, whose second terminal is connected to the ground voltage, and whose gate receives an evaluation signal.

7. The multi-port memory device as recited in claim 6, wherein each of the switches includes an NMOS transistor connected between each of the banks and the global data bus and receives the switch signal through gate.

8. The multi-port memory device as recited in claim 7, wherein the discharge signal generator comprises a plurality of NAND gates receiving the drive pulse and the data signal corresponding to each of the banks to thereby output the discharge signal.

9. The multi-port memory device as recited in claim 8, wherein the switch signal generator associated with a bank compromises a plurality of AND gates for logically combining the discharge signals except one corresponding to the bank to thereby output the switch signal.

10. The multi-port memory device as recited in claim 9, wherein each of the AND gates includes:
   an NAND gate receiving the discharge signals except the one corresponding to the bank; and
   an inverter for inverting an output from the NAND gate to thereby output the switch signal.

11. A multi-port memory device, comprising:
   a global data bus;
   a first bank including a first transmitter and a first receiver, the first transmitter and the first receiver exchanging data with the global data bus;
   a second bank including a second transmitter and a second receiver, the second transmitter and the second receiver exchanging data with the global data bus;
   a plurality of ports, each including a transmitter and a receiver for exchanging data with the global data bus;
   a first switch provided between the first bank and the global data bus for selectively connecting the first transmitter and the first receiver with the global data bus;
   a second switch provided between the second bank and the global data bus for selectively connecting the second transmitter and the second receiver with the global data bus;
   a switch signal generator for generating first and second switch signals, each of which turns on/off the first and the second switches, respectively,
   wherein the first switch is turned on and the second switch is turned off when the first transmitter transmits data to the global data bus and when the second transmitter discharges the global data bus, the first switch is turned off and the second switch is turned on.

12. The multi-port memory device as recited in claim 11, wherein each of the first and the second transmitters includes first NMOS transistor and second NMOS transistor serially connected to each other between the global data bus and a ground voltage, the first and the second NMOS transistors respectively receiving the drive pulse and the data signal through their corresponding gates.

13. The multi-port memory device as recited in claim 12, wherein each of the first and the second receivers includes:
   a first PMOS transistor whose first terminal is connected to a power voltage and whose second terminal and gate are diode-connected with each other;
   a second PMOS transistor whose first terminal is connected to the power voltage and whose second terminal is connected to an output terminal;
   a third NMOS transistor whose first terminal is connected to the second terminal of the first PMOS transistor, whose second terminal is connected to the global data bus, and whose gate receives a reference voltage;
   a fourth NMOS transistor whose first terminal is connected to the output terminal and whose gate receives the reference voltage; and
   a fifth NMOS transistor whose first terminal is connected to a second terminal of the fourth NMOS transistor, whose second terminal is connected to the ground voltage, and whose gate receives an evaluation signal.

14. The multi-port memory device as recited in claim 1, wherein the first transmitter transmits the data to the global data bus by discharging the global data bus.

15. The multi-port memory device as recited in claim 4, wherein the first transmitter transmits the data to the global data bus by discharging the global data bus.

16. The multi-port memory device as recited in claim 12, wherein the first transmitter transmits the data to the global data bus by discharging the global data bus.

* * * * *